United States Patent [19]

Laibowitz et al.

[11] Patent Number: 4,751,563
[45] Date of Patent: Jun. 14, 1988

[54] MICROMINIATURIZED ELECTRICAL INTERCONNECTION DEVICE AND ITS METHOD OF FABRICATION

[75] Inventors: Robert B. Laibowitz; Corwin P. Umbach, both of Peekskill, N.Y.

[73] Assignee: International Business Machines, Corp., Armonk, N.Y.

[21] Appl. No.: 668,537

[22] Filed: Nov. 5, 1984

[51] Int. Cl.⁴ .............................................. H01L 23/48
[52] U.S. Cl. ......................................... 357/71; 357/2; 357/5; 357/15; 357/55; 357/56; 357/67
[58] Field of Search ..................... 357/68, 71, 2, 5, 15, 357/55, 56, 67

[56] References Cited
U.S. PATENT DOCUMENTS

| | | | |
|---|---|---|---|
| 3,689,780 | 9/1972 | Meissner et al. | 307/306 |
| 3,846,166 | 11/1974 | Saiki et al. | 117/212 |
| 4,197,332 | 4/1980 | Broers et al. | 430/272 |
| 4,224,630 | 9/1980 | Kroger | 357/5 |
| 4,415,606 | 11/1983 | Cynkar et al. | 357/71 |
| 4,430,790 | 2/1984 | Ohta | 29/569 |

OTHER PUBLICATIONS

"Fabrication and Physical Properties of Ultrasmall Structures" by R. B. Laibowitz and A. N. Broers, Treatise on Materials Science and Technology, vol. 24, pp. 285–311.

Primary Examiner—Edward J. Wojciechowicz
Attorney, Agent, or Firm—Thomas J. Kilgannon

[57] ABSTRACT

This invention relates to an interconnection device which includes microminiaturized conductive interconnections between a pair of conductive layers and to a method for fabricating such devices. The conductive interconnections are made from normal metal, superconductors, low bandgap insulators, semimetals or semiconductors depending on the application, and form vias between the two layers of normal metallic, superconducting, low bandgap insulating, semimetallic or semiconducting materials, or any combination of these materials. The structure and method of the present invention revolve about contamination resist cone structures which are formed by irradiating a carbonaceous film such as silicone oil with an electron beam. After the contamination cones are formed on a substrate, using one fabrication approach, a conductive layer is deposited on a portion of a cone and over the structure. An insulating material is deposited conformally over the conductive layer and cone such that thickness of the insulating material over the conductive layer has a thickness less than the height of the contamination cone. Those portions of the insulation material, the conductive layer and the contamination cone which extend beyond the nominal surface of the insulating layer are removed, exposing a portion of the cone and a portion of the conductive layer which forms an interconnection. In a final step, another layer of conductive material is deposited on the insulation layer and on the exposed portion of the conductive interconnection and cone such that an electrically conductive interconnection is made between the just deposited conductive layer and the initially deposited conductive layer.

35 Claims, 2 Drawing Sheets

MICROMINIATURIZED ELECTRICAL INTERCONNECTION DEVICE AND ITS METHOD OF FABRICATION

FIELD OF THE INVENTION

This invention relates to an interconnection device which includes microminiaturized conductive interconnections between a pair of conductive layers and to a method for fabricating such devices. The conductive interconnections may be such that the resulting device is a Josephson weak-link device which includes both microbridges and tunnelling devices. The conductive interconnections are made from normal metal, superconductors, low bandgap insulators, semimetals or semiconductors depending on the application, and form vias between the two layers of normal metallic, superconducting, low bandgap insulating, semimetallic or semiconducting materials, or any combination of these materials. The structure and method of the present invention revolve about contamination resist cone structures which are formed by irradiating the surface of a substrate contaminated with a carbonaceous film such as silicone oil with an electron beam. The interaction of the electron beam with the contamination which diffuses towards the beam over time builds up a cone of contamination resist on the surface of the substrate. These insulating, contamination resist cones can have base diameters on the order of 100 nanometers or less. After the contamination cones are formed on a substrate, using one fabrication approach, a conductive layer is deposited on at least a portion of a cone and over the substrate. An insulating material is deposited conformally over the conductive layer and cone such that thickness of the insulating material over the conductive layer has a thickness less than the height of the contamination cone. Those portions of the insulation material, the conductive layer and the contamination cone which extend beyond the nominal surface of the insulating layer are removed, exposing a portion of the cone and a portion of the conductive layer which forms an interconnection. In a final step, another layer of conductive material is deposited on the insulation layer and on the exposed portion of the conductive interconnection and cone such that an electrically conductive interconnection is made between the just deposited conductive layer and the initially deposited conductive layer.

BACKGROUND ART

The advent of integrated circuits has clearly demonstrated the benefits which can be achieved by making electrical devices smaller and smaller. In a similar way, structures like weak-link devices which include microbridges and Josephson tunnelling devices also benefit from being made smaller and smaller. On a less exotic level, to the extent that metal lines having submicron dimensions are now being made, interconnections between levels of such metal layers must also be of a size which are compatible with the line dimensions. Presently used approaches are sometimes less than satisfactory in that the implementation of the resulting structures requires a good deal of chip area and may require several photolithographic masking and etching steps. As will be seen from a consideration of the prior art discussed hereinbelow, a number of different approaches have been used which incorporate electron beam or other type resists. In another approach, holes are simply formed in insulation layers and conductive material deposited therein to form a conductive interconnection.

U.S. Pat. No. 4,197,332 filed Feb. 12, 1979 shows the fabrication of contamination resist cones. The technique of this patent in the formation of contamination resist cones is utilized in the present application and is herewith incorporated by reference.

U.S. Pat. No. 4,224,630 filed Aug. 25, 1978 shows a SQUID comprised of two superposed superconductive layers with an insulating layer therebetween. A plurality of holes through the insulating layer filled with superconductive material form weak links between the layers. The structure is formed using standard photoresist procedures to pattern the holes in the insulation layer. Thereafter, superconducting material is formed over the insulator and in the holes.

U.S. Pat. No. 4,430,790 filed July 21, 1982 shows a triple layer superconducting device which comprises a superconductor-insulator-superconductor laminar arrangement on a substrate. A weak-link extends from one of the superconductor layers to the other across the thickness of the intervening separator. The resulting structures are characterized as "quasi-planar" devices as opposed to the structures of the present invention which are totally planar.

U.S. Pat. No. 3,689,780 filed Aug. 14, 1969 shows a number of weak-link structures which are formed between layers of superconducting materials. FIG. 8 of this reference shows a conical superconductor over which a weak-link material is formed. A pair of superconductive elements then contact the weak-link material on opposite sides thereof.

U.S. Pat. No. 3,846,166 filed Sept. 25, 1972 shows a pattern conductive layer over which an insulating layer is formed. The insulating layer is etched forming a truncated cone-like structure. A final layer of conductive material is deposited in the etched holes and over the top of the insulation forming interconnections between two levels of conductive material.

It is, therefore, a principle object of this invention to provide an interconnection device wherein the interconnection means may be an element of normal metal, an element of superconducting metal, an element of low bandgap insulator material, an element of semimetal material or an element of semiconductor material.

Another object is to provide an interconnection structure which is planar and therefore suitable for integrated circuit applications.

Still another object is to provide a fabrication method which utilizes contamination resist cones or portions thereof to provide interconnection structures with nanometer dimensions.

It is yet another object of the present invention to provide a fabrication method wherein the thickness of a conductor sandwiched insulation layer determines the length of the interconnection means.

BRIEF SUMMARY OF THE INVENTION

The present invention relates to an interconnection device and to a method for forming such structures. The interconnection structure includes a substrate on which an element of non-conductive material the shape of which is a frustum (or truncated cone) or a cone is disposed. It includes a first layer of conductive material a portion of which is disposed over the substrate and another portion of which is contiguous with a portion of the nonconductive element. It further includes an interconnection means disposed on at least a first portion of the surface of the nonconductive element, a first portion of the interconnection means electrically contacting the first layer. A layer of insulation is disposed on the first layer a portion of which is contiguous with a second portion of the interconnection means. Finally, a second layer of conductive material is disposed on the layer of insulation, a second portion of said element and in electrically contacting relationship with a third portion of the interconnection means. The layers of conductive material may be normal metals, semiconductors, semimetals, low bandgap insulators or superconductors. The interconnection means may be made of a normal metal, a superconducting metal, a semimetal, a semiconductor or a low bandgap insulator material. Depending on the materials used, the resulting structure may act as an interconnection between two normal or superconducting metals, an interconnection between two layers of semiconductor, a superconducting connection in the form of a Josephson microbridge between two superconducting layers or a Josephson element which carries tunnelling currents between two superconductive layers. The insulating layer may be made from any well-known insulator such as silicon dioxide, aluminum oxide, etc. The interconnection structures are made by contaminating the surface of a substrate with a layer of carbonaceous material. The contamination is then exposed to an electron beam for a time sufficient to form a contamination resist cone. A first layer of conductive material is deposited over the substrate and an electrical interconnection element is deposited either simultaneously or sequentially with the first layer conformally with at least a portion of the cone. A layer of insulating material is then conformally deposited over the conductive layer, the surface of the contamination cone and the interconnection element so that the thickness of the insulating material over the surface of the conductive layer is less than the aggregate height of the contamination cone and interconnection element. Those portions of the insulating layer, the interconnection element and the contamination cone which have a height greater than the nominal thickness of the insulating layer are removed to expose a portion of the cone and the interconnection element. Finally, a second layer of conductive material is formed over the insulation layer, exposed portions of the cone and interconnection element to form an electrically conductive connection between the first and second conductive layers.

These and other objects, features and advantages of the present invention will become more apparent from the following more particular description of a preferred embodiment.

DESCRIPTION OF THE PREFERRED EMBODIMENTS

Figure 1:
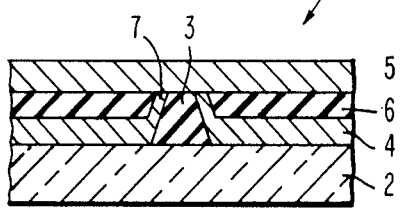
FIG. 1 shows a cross-sectional view of the structure of an interconnection device in accordance with the teaching of the present invention wherein an interconnection element is formed on a portion of cone (frustum) made of a contamination resist so that an electrical connection is formed between a pair of spaced, insulated conductive layers. The interconnection element may be a Josephson weak-link between a pair of superconducting layers such as a microbridge or a tunnelling barrier or it may be a semiconductor or just an ordinary metal acting as a via between two conductive layers. The structure shown is planar and is used when the thickness of the overlying conductive layer is approximately equal to or less than the height of the cone as originally formed.

Referring now to FIG. 1 there is shown a cross-sectional view of the structure of an interconnection device in accordance with the teaching of the present invention. In FIG. 1, an interconnection element is formed on a portion of a cone (frustum) made of a contamination resist so that an electrical connection is formed between a pair of spaced, insulated conductive layers. The interconnection element may be a Josephson weak-link between a pair of superconducting layers such as a microbridge or a tunnelling barrier. The interconnection means may also be a semiconductor, or a semimetal or just an ordinary metal acting as a via between two conductive layers. The structure shown is planar and is used when the thickness of an overlying conductive layer is approximately equal to or less than the height of the contamination cone as originally formed in order to produce a planar final structure.

In FIG. 1, interconnection device 1 includes a substrate 2 which may be made of insulating, conductive or superconductive material depending upon the use to which device 1 is to be put. A frustum or truncated cone 3 of insulating material is shown disposed on a surface of substrate 2. A pair of conductive layers 4,5 are shown sandwiching a layer 6 of insulating material except at the surface of truncated cone 3 where an interconnection element 7 interconnects conductive layers 4,5. Depending upon the application of device 1, interconnection element 7 may be formed from an ordinary metal like aluminum or formed from heavily doped polycrystalline silicon to render the polysilicon conductive. In these instances, conductive layers 4,5 may be aluminum or heavily doped polycrystalline silicon, respectively. Alternatively, interconnection element 7 may be made of a superconducting material which forms a microbridge. In this instance, conductive layers 4,5 may be made of niobium or any other suitable superconducting material. In all the instances mentioned, layer 6 may be any suitable insulating material such as silicon dioxide, aluminum oxide or niobium oxide. Frustum or truncated cone 3 is preferably made from a contamination resist. As will be discussed in some detail hereinafter, cones of contamination resist are formed by exposing a substrate 2 to silicone oil or other organic material vapors and subjecting the resulting layer of contamination on the substrate surface to an electron beam for a time sufficient to permit build-up into extremely small contamination resist cones.

In the structure of FIG. 1, the cone of contamination resist is truncated to form frustum 3 so that when conductive layer 5 is deposited, it will be both thin and planar. The structure of FIG. 1 may be utilized to form direct electrical connections between two layers of conductive or superconductive material and, in these instances, interconnection element 7 is made of conductive and superconductive material, respectively. In the structure of FIG. 1, conductive layers 4,5 may, of course, be made from different materials. As will be discussed more specifically hereinafter in connection with FIGS. 9–14, it should be appreciated that interconnection element 7 need not completely surround truncated cone 3. The desired material need only be formed on a portion of the surface of truncated cone 3 so that interconnection element 7 is only a narrow bridge of conductive material extending between conductive layers 4,5. In such an instance, layer 6 of insulating material would touch the surface of truncated cone 3 everywhere except where the bridge forming interconnection element 7 is present. In the instance just described, interconnection element 7, if made of superconducting material, would form a microbridge between conductive layers 4,5 which would also be made of a superconducting material.

Figure 2:
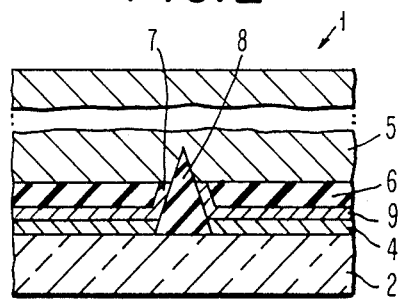
FIG. 2 shows a cross-sectional view of a structure similar to that shown in FIG. 1 except that the contamination cone as originally formed is used; the interconnection element material is different from the material of the conductive layers and the upper conductive layer is much thicker than the height of the cone. The resulting structure is substantially planar.

Referring now to FIG. 2, there is shown therein a cross-sectional view of a structure similar to that shown in FIG. 1 except that the contamination cone as originally formed is used; the material of interconnection element 7 is different from the materials of conductive layers 4,5 and the latter has a thickness which is much greater than the height of the contamination cone. The resulting structure is substantially planar.

In FIG. 2, the same reference numbers as used in FIG. 1 have been applied to the same features appearing in FIG. 2. In the latter, a cone 8 of contamination resist is substituted for frustum or truncated cone 3 of FIG. 1. In addition, conductive layer 9 is shown disposed atop conductive layer 4 and interconnection element 7 is formed from it. The structure of FIG. 2 may be utilized in situations where the thickness of conductive layer 5 is much greater than the height of cone 8. Under such circumstances, the fact that the tip of cone 8 extends beyond layer 6 will not result in any significant departure of the surface of conductive layer 5 from planarity. The structure of device 1 in FIG. 2 may be utilized where the material of interconnection element 7 must be different from that of conductive layers 4,5. Where, for example, it is desired to have interconnection element 7 made from a different material than layers 4,5, interconnection element 7 can be formed along with conductive layer 9 of the desired material. In this sort of structure, interconnection element 7 and layer 9 may be a low bandgap material such as cadmium sulphide, tellurium or indium oxide which permits tunneling between a pair of superconductive layers or it may be a metal, a semimetal such as bismuth or antimony or a semiconductor depending upon the desired application.

The structures shown in FIGS. 1, 2 can be fabricated in the extremely small dimensions which are common in the integrated circuit and other microminiaturized environments. Thus, frustum or truncated cone 3 and cone 8 may have a base diameter less than 100 nanometers. Insulating layer 6 may have a thickness in the 10 nanometer range but, in any event, it should be sufficiently thick to prevent appreciable numbers of electrons from tunnelling through it. Conductive layers 4,5 have thickness in the order of tens of nanometers and interconnection element 7 is normally of approximately the same length as the thickness of insulating layer 6 and is thinner than layer 4.

Figure 3:
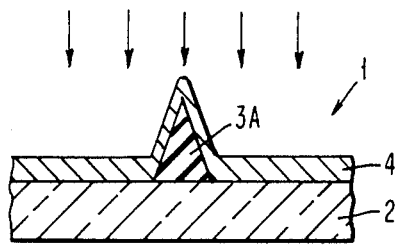
FIG. 3 shows a cross-sectional view of an interconnection structure like that shown in FIG. 1 at an intermediate stage in its fabrication wherein the interconnection element and a first layer of conductive material are made of the same conformally deposited material. The interconnection element material, as deposited, is thinner on the conical surface than that deposited on the surface of the substrate which supports the cone.

FIG. 3, there is shown a cross-sectional view of an interconnection structure like that shown in FIG. 1 at an intermediate stage in its fabrication wherein interconnection element 7 and a first layer of conductive material 4 are made of the same conformally deposited material. The material of interconnection element 7, as deposited, is thinner on the surface of cone 3A than that deposited on the surface of substrate 2 which supports the contamination cone 3A. In FIG. 3, a cone of contamination resist 3A is formed in a manner well-known to those skilled in the nanolithographic art and is described in detail in an article entitled "Fabrication and Physical Properties of Ultra Small Structures" by R. B. Laibowitz et al in a book entitled TREATISE ON MATERIALS SCIENCE AND TECHNOLOGY, Vol. 24, Academic Press Inc., 1982, beginning at page 291, Sec. C entitled "Contamination Lithography" and incorporated herein by reference. Briefly, substrate 2 may be exposed to vapors of a silicone oil such as that normally found in diffusion pumps. When an electron beam dwells for a sufficient length of time on a selected portion of the silicone layer, regions of the resist which have a cone-like configuration build up. Once contamination resist cone 3A is formed on the surface of substrate 2 and any residue of silicone oil film removed, both cone 3A and substrate 2 are subjected to an evaporation step which deposits conductive layer 4 conformally on the surfaces of cone 3A and substrate 2. The evaporating step may be carried out in any well-known manner and results in a conformally deposited layer which is thicker over the surface of substrate 2 than on the surface of cone 3A.

Figure 4:
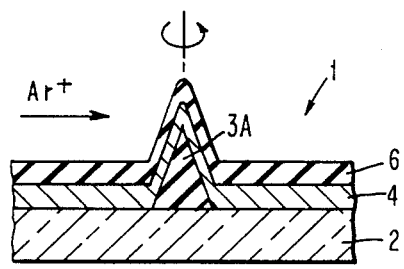
FIG. 4 shows a cross-sectional view of the structure of FIG. 3 after a layer of insulating material has been conformally deposited on the surface of the first layer of conductive material and the interconnection element.

FIG. 4 shows a cross-sectional view of the structure of FIG. 3 after a layer 6 of insulating material has been conformally deposited on the surface of conductive layer 4. Layer 6 may be deposited using any well-known vacuum evaporation technique or by sputtering. As previously indicated hereinabove, layer 6 may be any suitable insulating material which is appropriate for the ultimate purpose to which device 1 is to be put. In FIG. 4, the thickness of layer 6 should be carefully controlled inasmuch as its thickness determines the final length of interconnection element 7.

Figure 5:
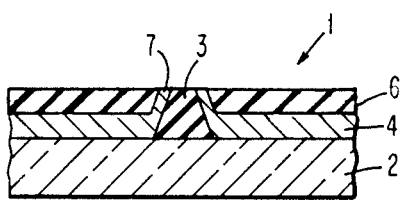
FIG. 5 shows a cross-sectional view of the structure of FIG. 4 after it has been ion-milled by an ion beam directed at the structure at a low angle with respect to the nominal substrate surface. This ion-milling truncates the contamination resist cone, exposes a portion of the interconnection means and forms a substantially planar structure.

FIG. 5 shows a cross-sectional view of the structure of FIG. 4 after it has been subjected to an argon ion-milling step which truncates contamination resist cone 3A forming truncated cone 3, exposing a portion of element 7 and providing a substantially planar surface. The ion-milling step is carried out in a well-known way by projecting ions such as argon in a direction parallel to the surface of substrate 2 while substrate 2 is being rotated. The ion-milling step is carried out for a time sufficient to remove that portion of contamination cone 3A which extends above the surface of layer 6 along with those portions of layers 4,6 which cover the tip of cone 3A.

In a final step, conductive layer 5 of FIG. 1 is deposited by vacuum evaporation or sputtering on the planar surface resulting from the ion-milling step of FIG. 5. The resulting structure is shown in FIG. 1. As previously indicated, layer 5 of conductive material may be the same material as the material of conductive layer 4 or it may be different. Once deposited on top of insulating layer 6, electrical contact with layer 4 is made via interconnection element 7 which is disposed around the cone. The resulting structure may be used as a microbridge or simple via on the material used to form interconnection element 7.

In connection with Josephson microbridges fabricated by the above described method, it should be appreciated that the present approach overcomes the low electrical resistance problem that is present in prior art microbridges. The low resistance has been the result of the large cross-sectional areas of the prior art bridges. To be useful in many applications, the normal resistance of a microbridge must be on the order of 1–10 ohms. Using the present approach, a microbridge with a niobium interconnection element 7 having a thickness of 5 nanometers and a length of 10 nanometers on a cone having a base diameter of 100 nanometers would have a resistance of 1 ohm. This resistance can be increased to 6 ohms by simply decreasing the cone base diameter to 30 nanometers and altering the fabrication procedure so that the material for interconnection element 7 is deposited on only one side of the cone.

To the extent that microbridge applications have been hindered by the appearance of hysteresis in the current-voltage characteristics of prior art microbridges due to inadequate heat dissipation, the three dimensional geometry of interconnection devices 1 described herein permits heat to be removed more efficiently from the ends of interconnection element 7 than does a strictly planar geometry. As a consequence, the amount of hysteresis in a microbridge is greatly reduced.

Referring again to FIG. 2 a method for fabricating it will be outlined hereinbelow in connection with FIGS. 6–8.

Figure 6:
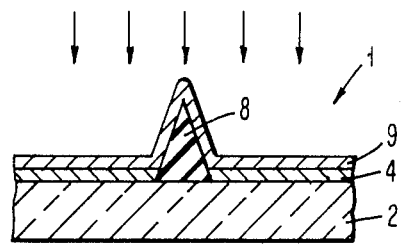
FIG. 6 shows a cross-sectional view of an interconnection structure like that shown in FIG. 2 at an intermediate stage in its fabrication wherein the conformally deposited material from which the interconnection element is formed is different from the material of the first deposited layer.

In FIG. 6, there is shown a cross-sectional view of interconnection device 1 like that shown in FIG. 2 at an intermediate stage in its fabrication. FIG. 6 shows a layer 4 of conductive material deposited on the surface of substrate 2. Layer 4 is first conformally deposited by vacuum evaporation or by sputtering on the surface of substrate 2 and on the surface of contamination cone 8. The latter has been previously formed in the same manner as described hereinabove in connection with FIG. 3. Once layer 4 is conformally deposited, it is subjected to an ion-milling step by projecting argon ions in a direction parallel to the surface of substrate 2 while the latter is rotating. In this manner, portions of layer 4 which are conformal with the surface of cone 8 are removed. Then, using another vacuum evaporation or sputtering step, a layer 9 of conductive material is conformally deposited on the exposed surfaces of layer 4 and cone 8A.

In FIG. 6, the material of layer 9 is normally different from that of layer 4 and the yet to be deposited layer 5. It may therefore be a semiconductor, a semimetal, a superconductor normal metal or a low bandgap insulator material.

Figure 7:
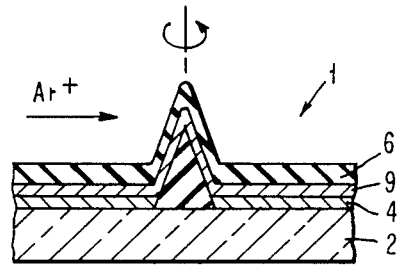
FIG. 7 shows a cross-sectional view of the interconnection structure of FIG. 6 at a later stage in its fabrication process after a layer of insulation is conformally deposited atop a layer of conductive material from which the interconnection element is formed.

Referring now to FIG. 7, there is shown a cross-sectional view of the structure of FIG. 6 after a layer 6 of insulation material is conformally deposited over layer 9. The thickness of layer 6, as previously indicated in connection with FIG. 4, must be carefully controlled inasmuch as its thickness determines the length of interconnection element 7.

Figure 8:
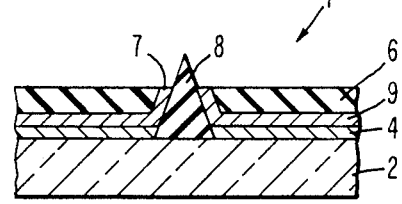
FIG. 8 shows a cross-sectional view of the interconnection structure of FIG. 7 after it has been subjected to an ion milling step parallel to the surface of the substrate whereby a portion of the insulation layer and interconnection element is removed to uncover the top of the contamination cone.

Referring now to FIG. 8, there is shown a cross-sectional view of the structure of FIG. 7 after it has been subjected to an ion-milling step in a direction parallel to the surface of substrate 2 for a time sufficient to remove those portions of layers 6,9 disposed on the tip of cone 8 which extends beyond the flat surface of layer 6. The remaining portion of layer 9 which is conformal with the surface of cone 8 forms interconnection element 7 which has an exposed portion flush with the surface of layer 6.

In a final step, layer 5 of conductive material is deposited over insulating layer 6, the exposed portion of interconnection element 7 and the tip of cone 8 which extends above the flat surface of layer 6. The thickness of layer 5 is sufficiently great so that its surface as shown in FIG. 2 is substantially planar. The structure after the deposition of layer 5 by vacuum evaporation or sputtering is shown in FIG. 2.

As indicated hereinabove, interconnection element 7 (formed from the same material as that of layer 9) is normally made from a different material than that for layers 4,5. If, for example, the latter two layers are superconductors and interconnection element 7 is a low bandgap insulator or a semiconductor instead of a superconducting metal bridge, then current will be carried through the device by tunnelling and the resulting device is a Josephson tunnelling junction rather than a microbridge. Using the present approach, junction areas over forty times smaller than those previously reported in the prior art can be achieved. The smaller junction area results in lower capacitance, lower RC products and hence, faster switching times than prior art tunnel junctions. Small values of RC also serve to reduce or eliminate switching hysteresis in tunnel junction current-voltage characteristics.

Figure 9:
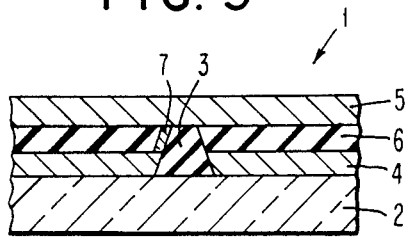
FIG. 9 is a cross-sectional view of an interconnection device like that shown in FIG. 1 except that the material of the interconnection element is different from that of the first and second conductive layers.

Referring now to FIG. 9, there is shown a cross-sectional view of an interconnection device 1 wherein interconnection element 7 is deposited on only a portion of the surface of truncated cone 3 and the material of interconnection element 7 is different from that of layers 4,5.

Figure 10:
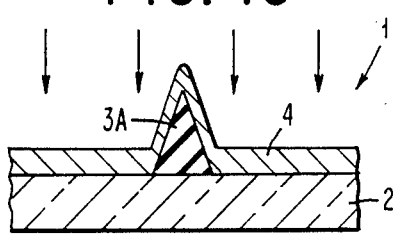
FIG. 10 is a cross-sectional view of the structure of FIG. 1 at an intermediate stage in its fabrication process after a layer of conductive material is deposited conformally over the substrate and contamination cone.

FIG. 10 shows a cross-sectional view of the structure of FIG. 9 at an intermediate stage in its fabrication after layer 4 is conformally deposited on the surface of substrate 2 and cone 3A. The structure shown is fabricated in the same way as described in connection with the structure of FIG. 3.

Figure 11:
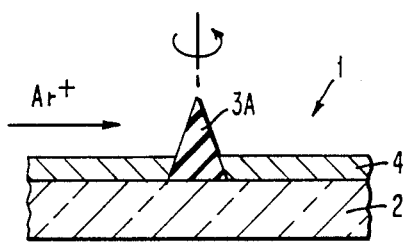
FIG. 11 is a cross-sectional view of the structure of FIG. 10 after it has been subjected to an ion-milling step in a direction parallel to the surface of the substrate while the latter is being rotated.

FIG. 11 shows a cross-sectional view of the structure of FIG. 10 after it has been subjected to an ion-milling step by projecting argon ions at cone 3A in a direction parallel to the surface of substrate 2 while the latter is being rotated. This step removes portions of layer 4 on the surface of cone 3A.

Figure 12:
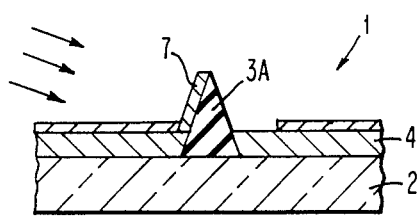
FIG. 12 is a cross-sectional view of the structure of FIG. 11 after an interconnection element has been formed on a portion of a cone by depositing a conductive material at a low angle with respect to the surface of the substrate and any residue of conductive material on the first conductive layer has been removed by ion-milling at a high angle with respect to the surface of the substrate.

FIG. 12 shows a cross-sectional view of the structure of FIG. 11 after interconnection element 7 has been deposited on a portion of cone 3A by vacuum evaporating the desired material at a low angle with respect to the surface of substrate 2. In this structure, interconnection element 7 may be made of a different material than that of layer 4, and may be a low bandgap material where interconnection element 7 is to be capable of carrying Josephson current. Alternatively, element 7 may be a superconducting material which is suitable for use with extremely small microbridges. To the extent a reside of material deposits on layer 4, it may be removed by argon ion-milling at a high angle with respect to the surface of substrate 2, leaving element 7 relatively unaffected.

Figure 13:
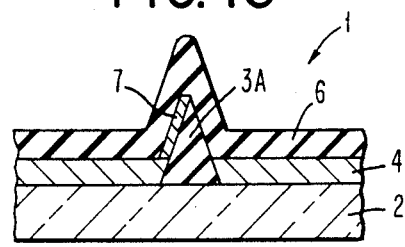
FIG. 13 is a cross-sectional view of the structure of FIG. 12 after a layer of insulating material has been conformally deposited over that structure.

FIG. 13 shows a cross-sectional view of the structure of FIG. 12 after layer 6 of insulating material is conformally deposited over the structure.

Figure 14:
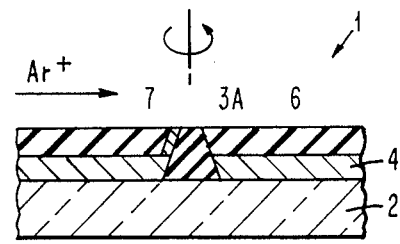
FIG. 14 is a cross-sectional view of the structure of FIG. 12 after that structure has been subjected to an ion-milling step which removes a portion of the insulating layer, a portion of the interconnection element and the tip of the cone to provide a planar structure.

FIG. 14 shows a cross-sectional view of the structure of FIG. 13 after the structure has been subjected to an argon ion-milling step in a direction parallel to the surface of substrate 2 while it rotates which truncates cone 3A forming frustum 3, removes that portion of layer 6 above its flat surface and exposes a portion of the end of element 7.

In a final step, layer 5 is deposited and interconnection device 1 of FIG. 9 results which is totally planar.

The structures and methods described hereinabove permit the fabrication of nearly ideal Josephson microbridges which have resistances suitable for device application. These microbridges have bridge lengths less than or equal to the coherence length in the superconductors connected to the ends of such bridges. The relatively large size and three dimensionality of the latter maximizes the heat dissipation from the bridge and simultaneously minimizes hysteresis in the electrical characteristics of the microbridge due to ohmic heating. In addition to microbridges, tunnel junctions with extremely small cross-sectional areas are possible.

While the structure and method of the present invention has been described in connection with a single frustum or a single cone, it should be appreciated that a plurality of such structures can be fabricated on the same substrate so that an array of interconnection devices 1 may be formed. The fabrication procedure is entirely compatible with integrated circuit technology so mass production of weak-link devices, and interconnections between metallization levels are entirely possible. Again, while only a single interconnection element 7 has been shown interconnecting a pair of metallization levels, it should be appreciated that the same approach can be utilized in connection with more than two levels.

Having thus described our invention, what we claim as new and desire to secure by Letters Patent is:

1. An electrical interconnection device comprising:
   a substrate,
   an element of nonconductive material the shape of which is a frustum the base of which is disposed on the surface of said substrate, having a first end, a middle portion, and a second end,
   a first layer of conductive material a first portion of which is disposed over said substrate and a second portion of which is contiguous with a first portion of said nonconductive element,
   an interconnection element having a first end, a middle portion, and a second end, said middle portion of said interconnected element disposed on said middle portion of the surface of said nonconductive element, said first end of said interconnection element electrically contacting said second portion of said first layer,
   a layer of insulating material disposed on said first layer, a portion of said layer of insulating material being contiguous with said middle portion of said interconnection element, and
   a second layer of conductive material disposed on said layer of insulating material, on said second end of said nonconductive element and electrically contacting said second end of said interconnection element.

2. An electrical interconnection device according to claim 1 further including a third layer of conductive material disposed between said first layer and said insulating layer a portion of said third layer being contiguous with said middle portion of said interconnection element.

3. An electrical interconnection device according to claim 1 wherein said element of nonconductive material is made of contamination resist.

4. An electrical interconnection device according to claim 1 wherein said element of nonconductive material is made of a cross-linked organic material.

5. An electrical interconnection device according to claim 1 wherein said element of nonconductive material is made of cross-linked silicone oil.

6. An electrical interconnection device according to claim 1 wherein said interconnection element is an electrically conductive element of normal metal.

7. An electrical interconnection device according to claim 1 wherein said interconnection element is a weak-link.

8. An electrical interconnection device according to claim 1 wherein said interconnection element is a conductive element of superconducting material.

9. An electrical interconnection device according to claim 1 wherein said interconnection element is an element of semiconductor material.

10. An electrical interconnection device according to claim 1 wherein said interconnection element is a semimetallic material.

11. An electrical interconnection device according to claim 1 wherein said interconnection element is a low bandgap material having a thickness sufficient to permit Josephson tunnelling therethrough.

12. An electrical interconnection device according to claim 1 wherein said first and second layers of conductive material are normal metals.

13. An electrical interconnection device according to claim 1 wherein said first and second layers of conductive material are superconducting metals.

14. An electrical interconnection device according to claim 1 wherein said first and second layers of conductive material are semiconductors.

15. An electrical interconnection device according to claim 1 wherein said first and second layers of conductive material are semimetals.

16. An electrical interconnection device according to claim 2 wherein said element of nonconductive material is made of a contamination resist, said first, second and third layers of conductive material are normal metals and said interconnection element is a normal metal.

17. An electrical interconnection device according to claim 2 wherein said element of nonconductive material is made of a contamination resist, said first, second and third layers of conductive material and said interconnection element are semiconductors.

18. An electrical interconnection device according to claim 2 wherein said element of nonconductive material is made of a contamination resist, said first, second and third layers of conductive material and said interconnection element are semimetal.

19. An electrical interconnection device according to claim 2 wherein said element of nonconductive material is made of a contamination resist, said second and third layers of conductive material are superconductors, said first layer of conductive material is a low bandgap material and said interconnection element is a low bandgap material which supports Josephson tunnelling.

20. An electrical interconnection device comprising:
a substrate,
an element of nonconductive material the shape of which is a frustum the base of which is disposed on the surface of said substrate, having a first end, a middle portion, and a second end,
a first layer of conductive material a first portion of which is disposed over said substrate and a second portion of which is contiguous with a first portion of said nonconductive element,
an interconnection element having a first end, a middle portion, and a second end, said middle portion of said interconnection element disposed on said middle portion of the surface of said nonconductive element, said first end of said interconnection element electrically contacting said second portion of said first layer,
a layer of insulating material disposed on said first layer, a portion of said layer of insulating material being contiguous with said middle portion of said interconnection element, and
a second layer of conductive material disposed on said layer of insulating material, on said second end of said nonconductive element and electrically contacting said second end of said interconnection element.

21. An electrical interconnection device according to claim 20 further including a third layer of conductive material disposed between said first layer and said insulating layer a portion of said third layer being contiguous with said middle portion of said interconnection element.

22. An electrical interconnection device according to claim 20 wherein said element of nonconductive material is made of contamination resist.

23. An electrical interconnection device according to claim 20 wherein said element of nonconductive material is made of a cross-linked organic material.

24. An electrical interconnection device according to claim 20 wherein said element of nonconductive material is made of cross-linked silicone oil.

25. An electrical interconnection device according to claim 20 wherein said element of nonconductive material is an electrically conductive element of normal metal.

26. An electrical interconnection device according to claim 20 wherein said interconnection element is a weak-link.

27. An electrical interconnection device according to claim 20 wherein said interconnection element is a conductive element of superconducting material.

28. An electrical interconnection device according to claim 20 wherein said interconnection element is an element of semiconductor material.

29. An electrical interconnection device according to claim 20 wherein said interconnection element is a low bandgap material having a thickness sufficient to permit Josephson tunnelling therethrough.

30. An electrical interconnection device according to claim 20 wherein said first and second layers of conductive material are superconducting metals.

31. An electrical interconnection device according to claim 20 wherein said first and second layers of conductive material are semiconductors.

32. An electrical interconnection device according to claim 20 wherein said first and second layers of conductive material are semimetals.

33. An electrical interconnection device according to claim 21 wherein said element of nonconductive material is made of a contamination resist, said first, second and third layers of conductive material are normal metals and said interconnection element is a normal metal.

34. An electrical interconnection device according to claim 21 wherein said element of nonconductive material is made of a contamination resist, said first, second and third layers of conductive material are normal metals and said interconnection element are semiconductors.

35. An electrical interconnection device according to claim 21 wherein said element of nonconductive material is made of a contamination resist, said first, second and third layers of conductive material are normal metals and said interconnection element are semimetal.

* * * * *